United States Patent [19]

Hanlon

[11] Patent Number: 5,229,772
[45] Date of Patent: Jul. 20, 1993

[54] RATIOMETRIC ADC WITH PULSE WIDTH MODULATED OUTPUT FOR WIDE TEMPERATURE RANGE APPLICATIONS

[75] Inventor: Michael M. Hanlon, Santa Clara, Calif.

[73] Assignee: Integrated Semiconductor Solutions, San Jose, Calif.

[21] Appl. No.: 829,230

[22] Filed: Feb. 3, 1992

[51] Int. Cl.[5] .................. H03M 1/50; H03M 1/12
[52] U.S. Cl. ................... 341/172; 341/167; 341/128; 341/155
[58] Field of Search .............. 341/172, 166, 167, 168, 341/169, 170, 128, 129, 143, 155

[56] References Cited

U.S. PATENT DOCUMENTS

| | | |
|---|---|---|
| 3,449,741 | 6/1969 | Egerton, Jr. |
| 3,462,759 | 8/1969 | Hoffman. |
| 4,268,820 | 5/1981 | Hareyama ............... 341/168 |
| 4,529,965 | 7/1985 | Lee ............... 341/172 X |
| 4,562,424 | 12/1985 | Takagi et al. ............... 341/166 |
| 4,567,465 | 1/1986 | Komiya ............... 341/168 |
| 4,584,566 | 4/1986 | Arcara ............... 341/167 |
| 4,608,553 | 8/1986 | Ormond ............... 341/167 X |
| 4,999,634 | 3/1991 | Brazdrum et al. ............... 341/172 |

*Primary Examiner*—Sharon D. Logan
*Attorney, Agent, or Firm*—Nathan N. Kallman

[57] ABSTRACT

An analog-to-digital converter (ADC) includes a capacitor array coupled to switches, an integrator stage connected to the switchable capacitors and a comparator stage connected to the output of the integrator stage. Means coupled to the comparator stage include a feedback loop to effectuate switching reference signals of opposite polarity for use during respective phases of operation of the ADC. The values of the capacitors can be programmed by the user of the ADC and switched to provide a desired total capacitance. For any fixed ratio of the input voltage to reference voltage, the duty cycle remains constant over a wide range of temperatures. Multiple stages afford large effective capacitor ratios with a small range of actual capacitance values and enable a reduction in silicon chip area for an ADC integrated circuit.

12 Claims, 4 Drawing Sheets

RATIOMETRIC ADC WITH PULSE WIDTH MODULATED OUTPUT FOR WIDE TEMPERATURE RANGE APPLICATIONS

FIELD OF INVENTION

This invention relates to analog-to-digital signal converters (ADCs) and in particular to an integrating type ADC in which high accuracy of the output signal is maintained over a relatively large temperature range.

BACKGROUND OF THE INVENTION

Integrating ADCs have been used for many years and have several advantages over other types of ADCs. However, integrating ADCs have disadvantages that generally preclude their use in applications which require high accuracy over a wide temperature range. For example, in order to improve accuracy, high cost precision resistors and special capacitors that have low errors over wide temperatures are required. Other errors are corrected by the use of additional operational amplifiers (Op Amps), resistors, capacitors and at times expensive microprocessors.

DESCRIPTION OF THE PRIOR ART

U.S. Pat. No. 4,647,905, Hantke et al, discloses an integrating type ADC in which the duty cycle output is the ratio of the input voltage divided by the reference voltage. The Hantke ADC comprises a first integrator, e.g. an operational amplifier, and a summing junction connected to the input terminal. The signal to be measured or converted is supplied to the input terminal. The other input to the summing junction is from a reversing switch element that is controlled by a threshold value converter. The reversing element supplies the summing junction of the first integrator and the threshold controller with a positive or negative reference voltage depending on the position of the reversing switch element. A second integrator is provided having its summing junction also connected to the input signal terminal an to the output of the reversing switch. The output of the second integrator is supplied to the other input terminal of the first integrator and acts as a reference signal for the first integrator. Since the reference signal from the second integrator act as a correcting signal to ensure that the output signal of the first integrator corresponds exactly to the input signal, the linearity of the converter is determined exclusively by the parameters of the second integrator.

The output of the first integrator is supplied to a third integrator which functions to provide a reference signal for the threshold value controller by having its output connected to the summing junction of the controller so that the signal is superimposed on the signal from the switching element. The voltage-time waveforms in one cycle of the sawtooth voltage of the first integrator are corrected to the same magnitude. There is therefore no further need for any offset equalization. The symmetry of the triangular voltage waveforms of the converter is dependent only on the parameters of the third integrator which must be designed with a very long time constant.

The main integrator can be designed as a fast operating Op Amp with relatively poor offset voltage. However, the second and third Op Amps must be designed with relatively low offset voltages and low offset voltage drifts. In addition the inherent nonlinearity due to the finite gain of the Op Amps and the change of finite gain with temperature, results in a lower conversion accuracy. Further the need for precision components, limits the accuracy over wide temperature swings. Lastly, the Hantke et al ADC is difficult and expensive to implement in a monolithic circuit because of the need for precision components.

The present invention discloses an integrating ADC that overcomes the above described problems and which allows total integration on a monolithic circuit without external components.

SUMMARY OF THE INVENTION

An object of this invention is to provide a monolithic integrating ADC circuit with no external components.

Another object of the invention is to provide an integrating ADC in which the output signal accuracy is maintained over a relatively large temperature range.

Another object is to provide an ADC that maintains a constant duty cycle over a wide range of temperatures for any fixed ratio of input voltage to reference voltage.

Another object of this invention is to provide an ADC using an array of capacitors that minimizes the use of silicon chip area.

A further object is to provide an ADC wherein stray capacitances are effectively cancelled.

A still further object is to provide an ADC that has programmable switching capacitors that allow establishing desired ratios of capacitor values to provide high resolution and gain.

In a preferred embodiment of this invention, an analog-to-digital converter (ADC) provides a constant duty cycle over a relatively large temperature range for any fixed ratio of input voltage to reference voltage. The ADC includes an array of capacitors coupled to programmable switches which allow adjustment of the values of the capacitors and thereby the ratio of the capacitor values. An integrator stage is connected to the output circuit of the capacitor array, and a comparator stage is connected to the output circuit of the integrator stage. The comparator stage includes trip voltages which determine the switching points of the reference voltage between negative polarity and positive polarity. The comparator output is processed by logic means which effectuates the alternate switching of the reference voltage polarities and defines the two phases of the duty cycle. In a specific embodiment, monolithic polysilicon to polysilicon capacitors are switched at a high rate to simulate high value resistances that are very stable with temperature changes. Arrays of capacitors are provided with switches which are controlled by means external to the integrated circuit in order to adjust the ratios between capacitors. This allows gain and resolution to be easily changed by the user without introducing additional errors. The arrays of capacitors are arranged so that the silicon chip area used for the ADC is significantly reduced. Multiple stages afford large effective capacitor ratios with a small range of actual capacitance values and thereby enable a reduction in silicon chip area for an ADC integrated circuit.

DESCRIPTION OF THE DRAWING

The invention will be described in greater detail with reference to the drawing in which:

FIG. 1b is a representation of a waveform of the output voltage of the ADC circuit shown in FIG. 1a;

FIG. 3 illustrates a modification of the integrator stage shown in FIG. 1a;

FIG. 4 illustrates a modification of the comparator stage shown in FIG. 1a;

FIG. 5b is a representation of the waveform of the output voltage of the ADC circuit shown in FIG. 5a.

DESCRIPTION OF THE PREFERRED EMBODIMENT

Figure 1A:
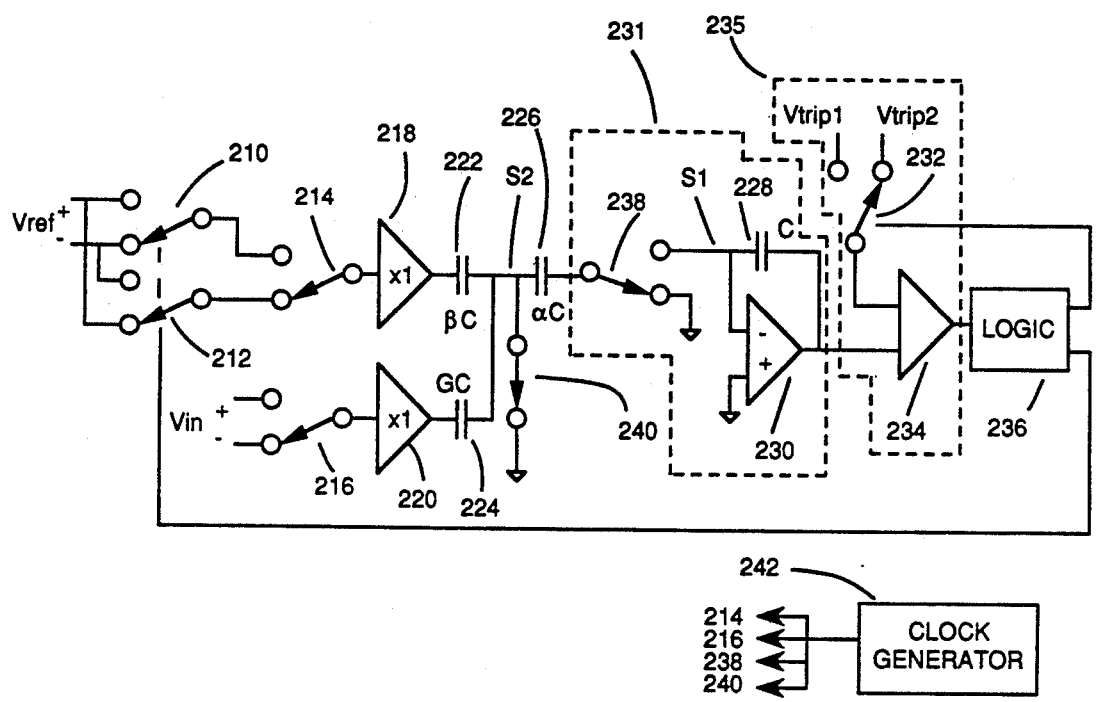
FIG. 1a is a schematic view of a single-ended half-circuit version of the preferred embodiment of the present invention.

FIG. 1a shows schematically a single-ended, half-circuit version of the preferred embodiment. A fully differential implementation provides high common mode rejection ratio and a first order cancellation of charge injection and leakage currents.

The arrangement shown in FIG. 1a comprises an input circuit including a pair of single input unity gain amplifiers 218 and 220. Amplifier 218 has its input connected to positive and negative terminals of a reference voltage source Vref by means of switches 210, 212 and 214. A high frequency two phase clock 242 controls the operation of Switch 214, as well as switches 216, 238 and 240 which are described later. Switch 210 connects Vref− or Vref+ to one terminal of switch 214 while switch 212 connects Vref+ or Vref− to the other terminal of switch 214.

Amp 220 is connect to the pair of voltage input terminals by switch 216 which is activated by the two phase clock 242 that also controls switch 214. The output of amp 218 is connected to summing junction S2 through capacitor 222. The output of amp 220 is connected to summing junction S2 through capacitor 224.

The arrangement shown in FIG. 1a further comprises an integrator stage including switch 238, op amp 230 and capacitor 228. Summing junction S2 is connected to input switch 238 of the integrator stage 231 through capacitor 226. Summing junction S2 is also connected to ground through switch 240. Switches 238 and 240 are both controlled by the two phase clock 242 and are both connected to ground during the same clock phase. During the other clock phase, switch 240 is open circuited while switch 238 connects the summing junction S2 to the input of Op Amp 230 through capacitor 226.

The means for controlling switches 210, 212 and 232 comprise the comparator 234, the logic circuit 236, the switch 232 and the pair of trip voltages Vtrip1 and Vtrip2.

The operation of the circuit shown in FIG. 1a is as follows: During clock phase 1, the switches are positioned as shown in FIG. 1a A charge is stored on capacitor 222 equal to Vref+ times BC and a charge is stored on capacitor 224 equal to Vin− times GC. Capacitor 226 is discharged.

During clock phase 2, switches 214, 216, and 238 are transferred to their other positions and switch 240 is opened. The charge on capacitor 228 across op amp 230 is equal to the previous charge, plus the incremental charge added by the function of the relative values of capacitors 222, 224, 226, and 228.

Figure 1B:
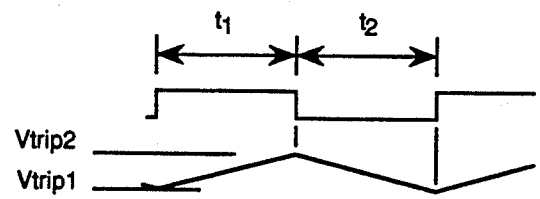

With continued alternating phases of the clock, the output voltage of the integrator 230 increases at a rate proportional to (GVin−Vref). The output voltage increases until it reaches Vtrip2 which, as shown in FIG. 1b, causes the output of the comparator 234 to change state. The logic circuit 236 causes each of the switches 210, 212 and 232 to assume the alternate position. The output voltage of integrator 230 then starts to decrease at a rate proportional to (GVin+Vref). The decrease continues until it reaches Vtrip1 which causes the comparator 234 to change to the opposite state. Switches 210, 212 and 232 likewise revert to their initial positions which is as shown in FIG. 1a.

By changing the coefficients $\alpha$, $\beta$ and G, the resolution of the ADC function and the gain of the virtual amplifier function can be independently adjusted. For example, the gain of the circuit is adjusted by changing the total capacitance value of capacitor 224. The capacitor 224 can be implemented as a variable capacitor by use of one or more of the networks shown in FIGS. 2a, 2b or 2c. In a similar manner, capacitor 222 and capacitor 226 can also be implemented by one or more of the networks shown in FIGS. 2a, 2b or 2c. The values of the switchable capacitors can be changed selectively by any of the digitally controlled switching techniques known in the prior art.

Figure 2A:
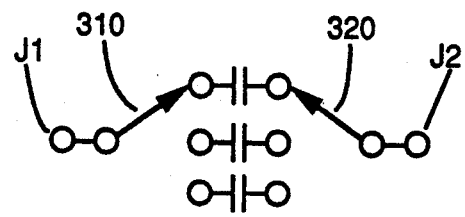
FIGS. 2a-2c illustrate a plurality of digitally controlled capacitance switching arrangements that may be employed in the monolithic circuit implementation of the present invention.
Figure 2B:
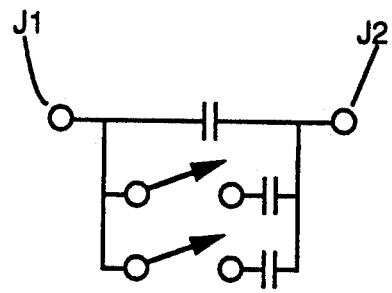
Figure 2C:
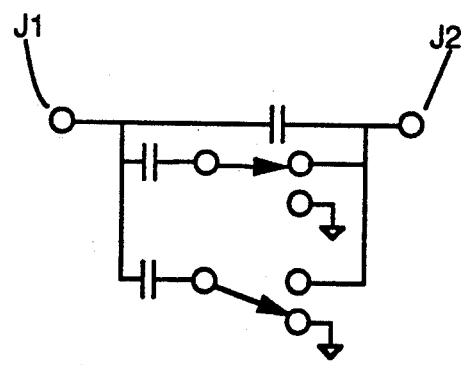

FIGS. 2a-2c illustrate three possible techniques that may be employed depending upon the desired results. In FIG. 2a, a set of capacitors is provided, each capacitor having a different value. A pair of digitally controlled switches 310 and 320 switch the selected capacitor into the circuit. The arrangement of FIG. 2a is not very efficient in terms of the silicon area required, particularly if the values are to cover an extended range.

FIG. 2b illustrates an arrangement where incremental values may be added in parallel to a fixed capacitance. This arrangement requires less silicon than the arrangement of FIG. 2a.

The capacitor switching circuit of FIG. 2c includes additional capacitances that serve two functions. In one switch position, the added capacitor is in parallel with the fixed capacitor, adding to the total capacitance. In the other switch position, the switchable capacitor in combination with the fixed capacitor forms a voltage divider. Multiple stages of FIG. 2c can be used to give very large effective ratios, with a small spread of actual capacitance values. This method requires less area than the arrangements of FIG. 2a or FIG. 2b.

Figure 3:
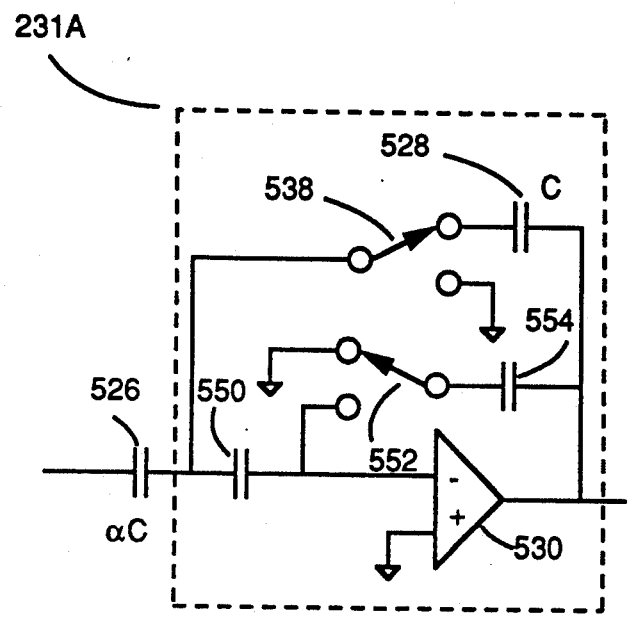

FIG. 3 illustrates a modification 231A of the integrator stage shown in FIG. 1a. The integrator stage 231A provides an offset voltage that is as low as possible. In FIG. 3 capacitors 526 and 528 correspond to capacitors 226 and 228 respectively; switch 538 corresponds to switch 238; and integrator 530 corresponds to integrator 230 of FIG. 2A. Capacitor 550, switch 552 and capacitor 554 are newly added components that were not employed in the circuit of FIG. 1a.

During clock phase 2, switch 538 is in the opposite position than shown in FIG. 3 so that capacitor 528 is open circuited and therefore holds the previous charge. The junction of capacitor 526 and capacitor 550 is connected to ground by switch 538. Capacitor 550 and capacitor 554 are now connected in such a way that the op amp integrator 530 is operating with a gain of C550/C554. The offset voltage of the op amp 530 plus the output voltage divided by the open loop gain of amp 530 appears on capacitor 550. Since the input offset voltage of amp 530 has been stored on capacitor 550 during clock phase 2, the junction of capacitor 526 and capacitor 550 is at virtual ground during clock phase 1.

The output voltage of op amp 530 is defined as:

$V = V_{desired} + V_{os}/A_{ol} + V_{out}/A_{ol}^2$ during clock phase 1 and $V = V_{desired} + V_{os} + V_{out}/A_{ol}$ during clock phase 2 where $V_{os}$ is the input offset voltage of op amp 530, and $A_{ol}$ is the open loop gain.

Therefore the output of the integrator circuit shown in FIG. 3 has minimum error during clock phase 1. The absolute voltage change of the amplifier's output from clock phase 1 to clock phase 2 is very small, thereby greatly relaxing the slew rate requirement of op amp 530.

For good performance at high resolutions and wide temperature excursions, the comparator stage shown in FIG. 1a, comprising comparator 234 and switch 232, should have high gain and as low as offset as possible. This contrasts with the simplified comparator structure shown in FIG. 5a which has the additional disadvantage that the offset voltages of the two comparators 20 and 22 are independent of each other.

Figure 4:
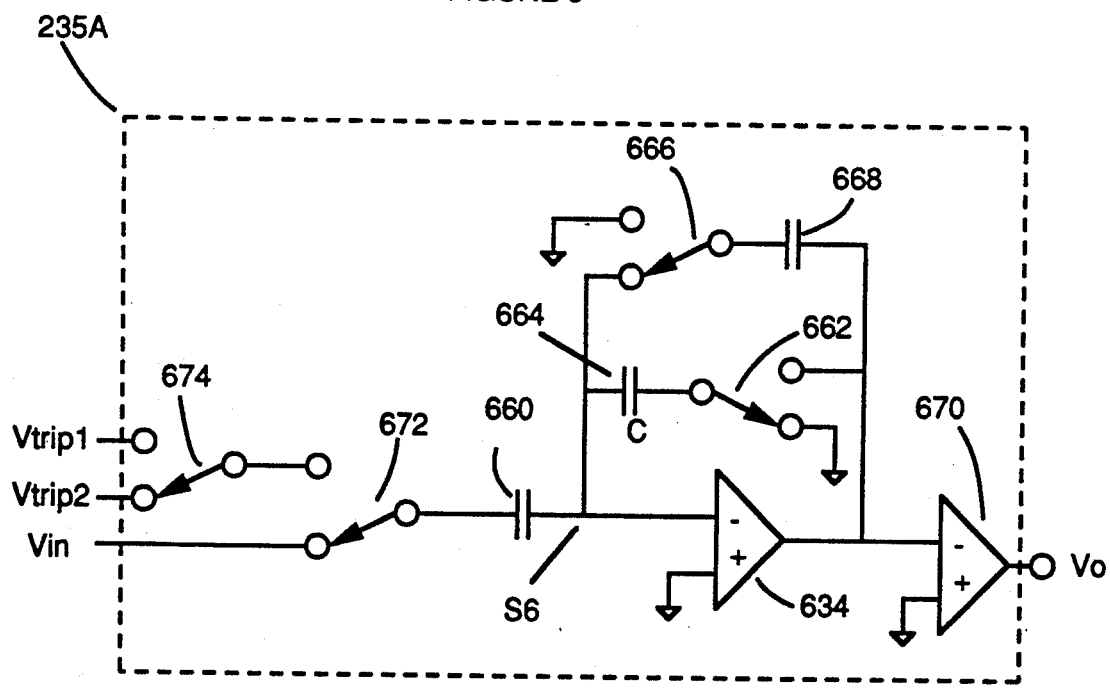

FIG. 4 is a schematic illustration of a modified comparator stage 235A which comprises a low offset preamplifier stage and a comparator. The comparator stage 235A can be used in place of the comparator stage 235 of FIG. 1a. The preamplifier of comparator stage 235A comprises capacitors 660, 664 and 668, switches 662, 666 and 672 and amplifier 634. During the opposite clock phase than that shown in FIG. 4, capacitor 660 is charged to $V_{trip} - V_{os}'$ of amp 634. For the clock phase that is shown in FIG. 4, the voltage across capacitor 660 is $V_{in} - V_{os}$ of amp 634, thus giving a net change in charge of $\Delta Q = C^* \Delta V = C660 * (V_{trip} - V_{in}) + (V_{os}' - V_{os})$. For capacitor 664, in the clock phase shown, Vos is stored and subtracts from Vo in the opposite clock phase. Capacitor 668 is charged to Vo in the clock phase not shown, and supplies a packet of charge equal to C668 * Vos in the phase shown. This action keeps the summing junction S6 relatively constant.

Figure 5A:
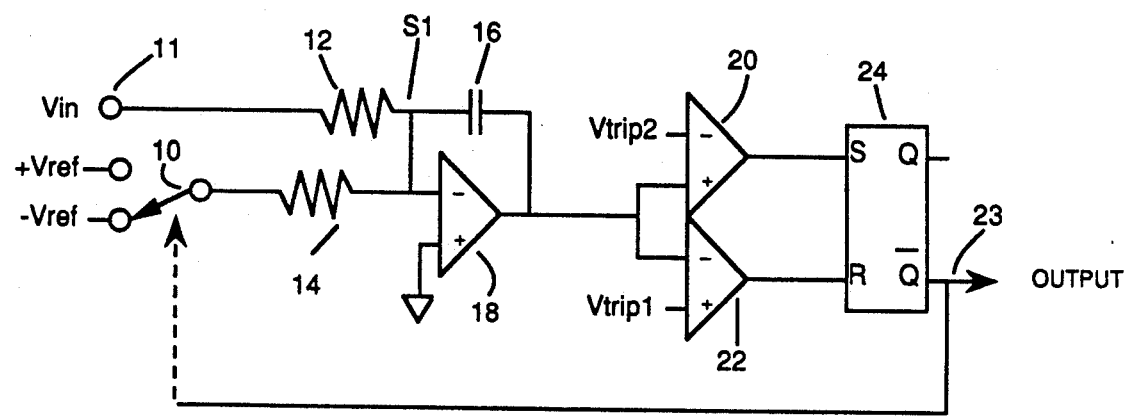
FIG. 5a is a schematic circuit diagram illustrating an alternative embodiment of an ADC employing resistive components.

FIG. 5a illustrates an alternative embodiment of an integrating ADC arrangement of the present invention in its simplest form. As shown in FIG. 5a, the arrangement includes an integrator comprising op amp 18, a capacitor 16, a pair of resistors 12 and 14, a switching element 10 and a pair of reference voltages. An input voltage to be measured is supplied at input terminal 11 which is connected to a summing junction S1 through resistor 12. One of the reference voltages +Vref or −Vref is selectively connected to summing junction S1 through resistor 14 by means of switch 10.

The ADC further includes a comparator arrangement comprising comparators 20 and 22 whose outputs are connected respectively to the set and reset terminals of a multivibrator 24. The output 23 of multivibrator 24 is fed back to switch 10 so as to position switch 10 in accordance with the set or reset state of multivibrator 24. A pair of trip voltages Vtrip1 and Vtrip2 are supplied respectively to one input of the comparators 22 and 20, while the output of the integrator 18 is supplied to the other terminals of comparators 20 and 22.

The operation of the simplified circuit shown in FIG. 5a is as follows. Assume that an input voltage Vin, within a defined range is applied to input terminal 11 and that the switch 10 is in the position shown in FIG. 5a. A current will flow through resistor 12 proportional to +Vin. Another current will flow through resistor 14 proportional to −Vref. The algebraic sum of the currents will flow through capacitor 16. Because Vin is bounded, the absolute value of current caused by −Vref can be made larger than the absolute value of the current caused by Vin. The output of op amp 18 therefore increases until the voltage reaches Vtrip2 at comparator 20.

Figure 5B:
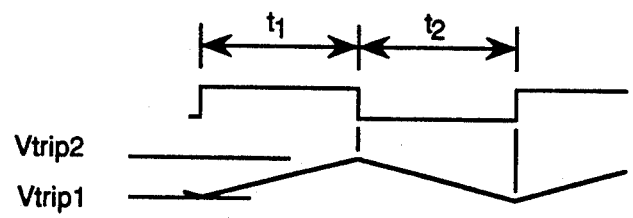

At this point the multivibrator 24 is set which causes the switch 10 to move to the other position. The current caused by +Vref flowing through resistor 14 now adds to the current from the input voltage. The output voltage of op amp 20 therefore begins to decrease as shown in FIG. 5b. When the output voltage decreases to Vtrip1, the multivibrator 24 is reset which causes switch 10 to return to its original position. The cycle is then repeated. The transfer function of the ADC assuming that resistors 12 and 14 are of equal value, is $(t1-t2) / (t1+t2) = V_{in} / V_{ref}$ By setting the ratio of the values of resistors 12 and 14 so that the value of resistor 14 is G times the value of resistor 12, a virtual gain is created and the transfer function becomes $(t1-t2) / (t1+t2) (G^*V_{in}) / V_{ref}$ where $G = R14 / R12$.

In the preferred embodiment illustrated in FIG. 1a, the ratio of the capacitor values serves an analogous function to the ratio of resistor values of the circuit of FIG. 5a. A selection of the capacitor ratio can be made by means external to the integrated circuit. This can be accomplished by providing control of the inputs to various switches to the user. The switches shown in circuits of FIGS. 2a-2c are not sensitive to the finite ON resistance, so that no error is introduced.

The novel ADC converter configuration is characterized by a duty cycle which remains constant with changes in temperature for a fixed ratio of input voltage to reference voltage, and a fixed ratio of capacitor values. While a change in Vtrip1 or Vtrip2 will affect t1 and t2, the change results in (t1−t2)/(t1+t2) remaining a constant. Any "ON" resistance of a switch does not affect the accuracy of the conversion process. The topology of the amplifiers can be made to have an effective gain of $A^2$ which greatly improves the linearity of the preamp and integrator functions, provides compensation for the initial offset voltage and compensate for apparent offset voltage change due to finite gain of the amplifiers. The monolithic integrated ADC disclosed herein incorporates an array of capacitors using a minimum area of silicon. Also the pulse width modulated output of the ADC disclosed herein eliminates the need for precision components. Stray capacitance is minimized since the differential circuit cancels opposing stray capacitances. Furthermore, a programmable ADC resolution and a programmable gain instrumentation amplifier function are provided.

In keeping with this invention, during operation of the ADC, with a fixed ratio of input voltage to reference voltage and a fixed selection of capacitor values, the ratio of the positive and negative going phases remain the same so that temperature change does not affect the duty cycle of the ADC which remains constant. The ADC can operate without any significant adverse effects that may be caused by a wide swing in temperature, such as from −40 to 125 degrees Centigrade, as compared to prior art ADC circuits which can operate only over a significantly smaller and limited temperature range.

What is claimed is:

1. An analog-to-digital converter for providing a constant duty cycle that is a constant ratio of input voltage divided by reference voltage over a relatively large range of temperature comprising:
   an input circuit for receiving reference voltage and input voltage signals;
   means for providing an input voltage signal to said input circuit;
   a source of negative and positive reference voltage signals;
   switching means coupled to said source for selectively supplying reference voltage signals of first and second polarities respectively to said input circuit;
   a clock generator for providing alternating phases of operation of said converter;
   a single integrator stage coupled to said input circuit for receiving said reference voltage and input voltage signals;
   a capacitor array coupled between said input circuit and said integrator stage;
   a comparator stage coupled to said integrator stage for comparing the output signal from said integrator to trip voltages;
   logic means coupled to the output of said comparator means and to said switching means that is coupled to said source for actuating said switching means to change said reference signals alternately between negative and positive polarities so that said duty cycle is defined by two phases of negative going and positive going signal waveforms.

2. An analog-to-digital converter as in claim 1, including first and second switches for connecting said input circuit to said reference signal switching means and to said input voltage signal providing means respectively; a summing junction to which said input voltage signal and said reference signal are applied; first and second comparators for receiving a summed signal from said junction during said first and second phases of operation respectively; a third switch coupled to a summing junction of said capacitor array; and a fourth switch coupled to said capacitor array and said integrator stage.

3. An analog-to-digital converter as in claim 2, including a clock generator for controlling said reference signal switching means and said first, second, third and fourth switches.

4. An analog-to-digital converter as in claim 3, wherein said clock generator is a two phase clock for providing alternating phases of operation.

5. An analog-to-digital converter as in claim 4, wherein said switching means is connected to said source of reference voltage of negative polarity during a first phase of the duty cycle of said converter, so that the current produced by said negative voltage is greater than the current produced by an input voltage signal, whereby the output of said integrator is increased accordingly.

6. An analog-to-digital converter as in claim 4, wherein said switching means is connected to a source of reference voltage of positive polarity during a second phase of the duty cycle of said converter, so that the current produced by said positive voltage is less than the current produced by an input voltage signal, whereby the output of said integrator is decreased accordingly.

7. An analog-to-digital converter as in claim 1, wherein said input circuit includes first and second unity gain amplifiers, said first amplifier being connected between a first switch of said switching means coupled to said reference signal source and a first capacitor of said capacitor array, said second amplifier being connected between a second switch of said switching means coupled to said input voltage signal providing means and a second capacitor of said capacitor array.

8. An analog-to-digital converter as in claim 7, wherein said capacitor array comprises a third capacitor, said third capacitor being connected at a summing junction, and to the input circuit of said integrator stage.

9. An analog-to-digital converter as in claim 8, wherein said integrator stage comprises an operational amplifier and a capacitor for processing the signal provided to said input circuit of said integrator stage.

10. An analog-to-digital converter as in claim 1, including feedback means coupled between said actuating means and said switching means.

11. An analog-to-digital converter as in claim 1, wherein said actuating means comprises a logic circuit.

12. An analog-to-digital converter comprising:
   first and second amplifiers;
   means for applying an input voltage to said first amplifier;
   a source of reference voltage for providing positive and negative reference signals to said second amplifier;
   switching means connected between said input voltage applying means, said reference voltage source and said amplifiers;
   first, second and third capacitors coupled to the output of said amplifiers, said capacitors being connected to a summing junction;
   an integrator coupled to said summing junction for varying the output voltage of said converter in response to the ratio between the input voltage and reference voltage;
   logic means coupled to receive a signal representing said voltage ratio, said logic means processing said signal for varying the positions of said switching means.

* * * * *